United States Patent
Shinohara

(10) Patent No.: US 10,424,538 B2
(45) Date of Patent: Sep. 24, 2019

(54) ANISOTROPIC CONDUCTIVE FILM

(71) Applicant: DEXERIALS CORPORATION, Tokyo (JP)

(72) Inventor: Seiichiro Shinohara, Kanuma (JP)

(73) Assignee: DEXERIALS CORPORATION, Tokyo (JP)

( * ) Notice: Subject to any disclaimer, the term of this patent is extended or adjusted under 35 U.S.C. 154(b) by 523 days.

(21) Appl. No.: 15/027,607

(22) PCT Filed: Sep. 18, 2014

(86) PCT No.: PCT/JP2014/074639
§ 371 (c)(1),
(2) Date: Apr. 6, 2016

(87) PCT Pub. No.: WO2015/056518
PCT Pub. Date: Apr. 23, 2015

(65) Prior Publication Data
US 2016/0240468 A1    Aug. 18, 2016

(30) Foreign Application Priority Data

Oct. 15, 2013   (JP) ................................ 2013-214753

(51) Int. Cl.
| | | |
|---|---|---|
| B32B 27/08 | (2006.01) | |
| H01L 23/498 | (2006.01) | |
| C09J 9/02 | (2006.01) | |
| H01L 23/00 | (2006.01) | |
| H05K 3/32 | (2006.01) | |

(52) U.S. Cl.
CPC ........ *H01L 23/49838* (2013.01); *B32B 27/08* (2013.01); *C09J 9/02* (2013.01); *H01L 23/49811* (2013.01); *H01L 23/49866* (2013.01); *H01L 24/27* (2013.01); *H01L 24/29* (2013.01); *H01L 24/83* (2013.01); *H05K 3/323* (2013.01); *B32B 2307/202* (2013.01); *B32B 2307/206* (2013.01); *B32B 2307/706* (2013.01); *B32B 2457/00* (2013.01); *H01L 24/05* (2013.01); *H01L 24/32* (2013.01); *H01L 2224/04026* (2013.01); *H01L 2224/05644* (2013.01); *H01L 2224/271* (2013.01); *H01L 2224/27003* (2013.01); *H01L 2224/29028* (2013.01); *H01L 2224/2939* (2013.01); *H01L 2224/29082* (2013.01); *H01L 2224/29083* (2013.01); *H01L 2224/29355* (2013.01); *H01L 2224/29455* (2013.01); *H01L 2224/32104* (2013.01); *H01L 2224/32227* (2013.01); *H01L 2224/83101* (2013.01); *H01L 2224/83203* (2013.01); *H01L 2224/83851* (2013.01); *H01L 2224/83862* (2013.01); *H01L 2924/381* (2013.01)

(58) Field of Classification Search
None
See application file for complete search history.

(56) References Cited

U.S. PATENT DOCUMENTS

| | | | |
|---|---|---|---|
| 9,816,012 B2 * | 11/2017 | Shinohara ................. | C09J 9/02 |
| 2009/0090545 A1 * | 4/2009 | Usui ...................... | H01L 24/27 |
| | | | 174/260 |
| 2013/0196129 A1 | 8/2013 | Lee et al. | |

FOREIGN PATENT DOCUMENTS

| | | |
|---|---|---|
| JP | H04-366630 A | 12/1992 |
| JP | 2003-013021 A | 1/2003 |
| JP | 2003-286457 A | 10/2003 |
| JP | 2005-200521 A | 7/2005 |
| JP | 2007-080522 A | 3/2007 |
| JP | 2008-103347 A | 5/2008 |
| JP | 22009-134914 A | 6/2009 |
| JP | 2010-009804 A | 1/2010 |
| JP | 2010-067360 A | 3/2010 |
| JP | 32010-199087 A | 9/2010 |
| JP | 2010-278025 A | 12/2010 |
| JP | 4789738 B2 | 10/2011 |
| JP | 4887700 B2 | 2/2012 |
| JP | 2012-134155 A | 7/2012 |
| JP | 2013-143292 A | 7/2013 |
| WO | 2005/068573 A1 | 7/2005 |

(Continued)

OTHER PUBLICATIONS

Mar. 29, 2017 Office Action issued in Chinese Patent Application No. 201480054891.7.
Aug. 1, 2017 Office Action issued in Korean Patent Application No. 10-2016-7008804.
Aug. 30, 2016 Office Action issued in Japanese Patent Application No. 2013-214753.
May 1, 2018 Office Action issued in Korena Patent Application No. 10-2016-7008804.
Nov. 10, 2016 Office Action issued in Taiwanese Patent Application No. 103132957.
Nov. 4, 2014 Search Report issued in International Patent Application No. PCT/JP2014/074639.
Jun. 2, 2015 Written Opinion issued in International Patent Application No. PCT/JP2014/074639.

(Continued)

*Primary Examiner* — Sheeba Ahmed
(74) *Attorney, Agent, or Firm* — Oliff PLC

(57) ABSTRACT

An anisotropic conductive film that is capable of suppressing the occurrence of short circuit during anisotropic conductive connection of electrical components having decreased pitch, and suppressing a decrease in conduction reliability during storage under a high temperature and high humidity environment has a structure in which a conductive particle-containing layer containing conductive particles that are arranged in a single layer in a layered binder resin composition is layered on at least a first insulating resin composition layer. The lowest melt viscosity of the binder resin composition is equal to or higher than that of a first insulating resin composition. A second insulating resin composition layer is further layered on a surface of the conductive particle-containing layer on a side opposite to the first insulating resin composition layer. The lowest melt viscosity of the binder resin composition is higher than those of the first and second insulating resin compositions.

5 Claims, 6 Drawing Sheets

(56) References Cited

FOREIGN PATENT DOCUMENTS

WO 2013/089199 A1 6/2013

OTHER PUBLICATIONS

Apr. 26, 2016 International Preliminary Report on Patentability issued in International Patent Application No. PCT/JP2014/074639.
Mar. 2, 2017 Office Action issued in Japanese Patent Application No. 2013-214753.
Feb. 6, 2018 Office Action issued in Korean Patent Application No. 10-2016-7008804.
Nov. 24, 2017 Office Action issued in Chinese Patent Application No. 2014800548911.
Oct. 18, 2018 Office Action issued in Chinese Application No. 201480054891.7.
Jun. 28, 2019 Office Action issued in Chinese Application No. 201480054891.7.

\* cited by examiner

ANISOTROPIC CONDUCTIVE FILM

TECHNICAL FIELD

The present invention relates to an anisotropic conductive film.

BACKGROUND ART

In many display devices such as a liquid crystal panel and an organic EL panel, a driver IC is anisotropically conductively connected to a substrate through an anisotropic conductive film. In recent years, the pitch between bumps of such an IC is decreased to achieve an increase in the precision and an enhancement in the performance of the display devices.

As a countermeasure for the decrease in the pitch between bumps of an IC, the arrangement of conductive particles in a single layer in an anisotropic conductive film has been conventionally proposed. For example, there have been the following proposals. In one proposal, conductive particles are dispersed in an adhesive layer of an adhesion sheet in which the adhesive layer is formed on a base sheet, the conductive particles that are not in contact with the adhesive layer are removed by air blow to form a conductive particle-containing layer of a single layer, and the base sheet having the conductive particle-containing layer formed thereon is biaxially stretched with a predetermined stretch factor to achieve an intended interparticle distance, thereby arranging the conductive particles in a single layer (Patent Literature 1). In another proposal, conductive particles are arranged at a specific region of a magnetic medium, excessively adhered conductive particles are removed, and the arranged conductive particles are then transferred to an insulating adhesive film, thereby arranging the conductive particles in a single layer (Patent Literature 2). In these cases, it is considered that a decrease in pitch is easily achieved by decreasing the particle diameter of the conductive particles and increasing the density of the conductive particles in an anisotropic conductive film.

CITATION LIST

Patent Literature

Patent Literature 1: Japanese Patent No. 4789738
Patent Literature 2: Japanese Patent No. 4887700

SUMMARY OF INVENTION

Technical Problem

However, an anisotropic conductive film of a single layer type that includes only the conductive particle-containing layer produced by the techniques of Patent Literatures 1 and 2 or an anisotropic conductive film of a two-layer structure type in which an insulating resin composition layer is further layered may not sufficiently cope with a decrease in the pitch of an IC chip at high level. Specifically, there may be problems in which the occurrence of short circuit is increased during anisotropic conductive connection of electrical components using such an anisotropic conductive film and the conduction resistance is increased during storage under a high temperature and high humidity environment to decrease the conduction reliability.

An object of the present invention is to solve the problems in the conventional techniques. Also an object thereof is to suppress the occurrence of short circuit during anisotropic conductive connection of electrical components having decreased pitch using an anisotropic conductive film, as well as to suppress a decrease in conduction reliability during storage under a high temperature and high humidity environment.

Solution to Problem

The present inventor has found that in an anisotropic conductive film in which a conductive particle-containing layer containing conductive particles that are arranged in a single layer in a layered binder resin composition is layered on at least a first insulating resin composition layer, or in an anisotropic conductive film in which a second insulating resin composition layer is further layered on a surface of the conductive particle-containing layer on a side opposite to the first insulating resin composition layer, when the lowest melt viscosity of each resin composition is adjusted, the object of the present invention can be achieved. The present invention has been completed.

Specifically, the present invention provides an anisotropic conductive film including a conductive particle-containing layer containing conductive particles that are arranged in a single layer in a layered binder resin composition on at least a first insulating resin composition layer, wherein the binder resin composition has a lowest melt viscosity that is equal to or higher than that of the first insulating resin composition. The anisotropic conductive film of the present invention encompasses the following aspects.

According to an aspect, a second insulating resin composition layer is further layered on a surface of the conductive particle-containing layer on a side opposite to the first insulating resin composition layer, and the lowest melt viscosity of the binder resin composition is higher than those of the first and second insulating resin compositions.

This aspect encompasses an aspect in which the lowest melt viscosity of one of the first and second insulating resin compositions is higher than that of the other, and an aspect in which a thickness of one of the first insulating resin composition layer and the second insulating resin composition layer is larger than that of the other when the lowest melt viscosities of the first and second insulating resin compositions are the same or substantially the same as each other.

The present invention further provides a connected body in which a terminal of a first electrical component is anisotropically conductively connected to a terminal of a second electrical component through the anisotropic conductive film of the present invention, and the conductive particle-containing layer is curved when a cross section of the connected body is observed from a side direction.

Advantageous Effects of Invention

In the anisotropic conductive film of the present invention having the conductive particle-containing layer containing the conductive particles that are arranged in a single layer in the layered binder resin composition on the first insulating resin composition layer, the lowest melt viscosity of the binder resin composition is adjusted so as to be equal to or higher than that of the first insulating resin composition. Therefore, for a connected body that is formed by anisotropic conductive connection of a terminal of a first electrical component to a terminal of a second electrical component so as to dispose the anisotropic conductive film between them with the first insulating resin composition layer located on a side of the first electrical component, when a connection face thereof is observed from a plane direction thereof, it may appear that conductive particles 1 that are mixed at high particle density, as shown in FIG. 1A, continuously come into contact with each other, resulting in short circuit of electrodes 2. However, the observation from a direction of a cross section taken along line A-A, as shown in FIG. 1B, shows that a conductive particle-containing layer 10 that is thermocompression bonded between a terminal 3a of a first electrical component 3 and a terminal 4a of a second electrical component 4 is pressed against a side opposite to a first insulating resin composition layer 11, and curved. As a result, the conductive particles 1 are shifted to a side of the second electrical component 4, and separated from each other in a thickness direction. For this reason, the occurrence of short circuit is suppressed and a decrease in conduction reliability is also suppressed. In this case, resin components in the conductive particle-containing layer 10 and the first insulating resin composition layer 11 are mixed. As a result, an interface thereof may often be indistinct. Further, the first insulating resin composition layer 11 may enter the conductive particle-containing layer 10 on the side of the second electrical component 4. FIG. 1B shows a state where the first insulating resin composition layer 11 enters the conductive particle-containing layer 10 on the second electrical component 4 side.

The second insulating resin composition layer is further layered on a surface of the conductive particle-containing layer on a side opposite to the first insulating resin composition layer. At that time, when the lowest melt viscosity of the binder resin composition is higher than those of the first and second insulating resin compositions, the lowest melt viscosity of one of the first and second insulating resin compositions is considered to be higher than that of the other. When the lowest melt viscosity of a first insulating resin composition layer 20 is lower than that of a second insulating resin composition layer 21, a conductive particle-containing layer 22 is pressed against a side of the first insulating resin composition in which the lowest melt viscosity is lower, and curved as shown in FIG. 2. As a result, the conductive particles are separated from each other in the thickness direction. For this reason, the occurrence of short circuit is suppressed and a decrease in conduction reliability is also suppressed. In this case, resin components in the conductive particle-containing layer 22, the first insulating resin composition layer 20, and the second insulating resin composition layer 21 are mixed together. As a result, an interface thereof may often be indistinct.

When the lowest melt viscosities of the first and second insulating resin compositions are the same or substantially the same as each other, it is considered that the conductive particle-containing layer cannot be curved. However, the thickness of one of a first insulating resin composition layer 30 and a second insulating resin composition layer 31 may be larger than that of the other, as shown in FIG. 3. When the thickness of the first insulating resin composition layer 30 is larger than that of the second insulating resin composition layer 31, a conductive particle-containing layer 32 is pressed against a side of the second insulating resin composition layer 31 in which the thickness is smaller, and curved. As a result, the conductive particles are separated from each other in the thickness direction. For this reason, the occurrence of short circuit is suppressed and a decrease in conduction reliability is also suppressed. In this case, resin components in the conductive particle-containing layer 32, the first insulating resin composition layer 30, and the second insulating resin composition layer 31 are mixed together. As a result, an interface thereof may often be indistinct.

When the height of a terminal (for example, a bump) of the first electrical component is largely different from that of a terminal (for example, a bump) of the second electrical component, the conductive particle-containing layer may be pressed against a side in which the terminal height is lower, and curved.

DESCRIPTION OF EMBODIMENTS

<Anisotropic Conductive Film>

Figure 4:
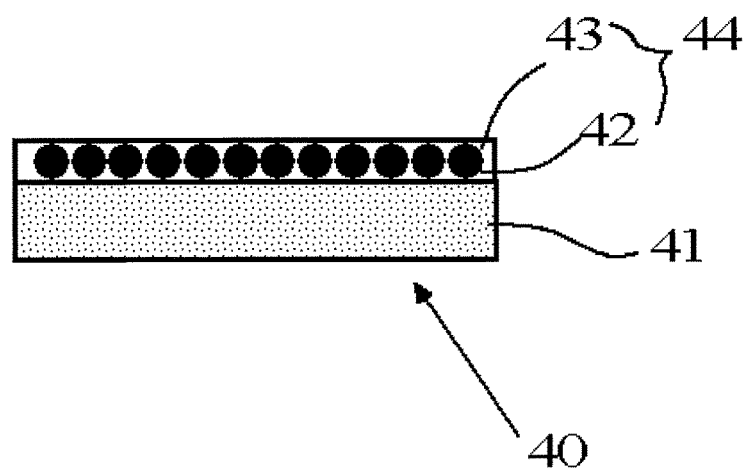
FIG. 4 is a cross-sectional view of an anisotropic conductive film of the present invention.

As shown in FIG. 4, an anisotropic conductive film 40 of the present invention has a structure in which a conductive particle-containing layer 44 containing conductive particles 42 that are arranged in a single layer in a layered binder resin composition 43 is layered on at least a first insulating resin composition layer 41, and the lowest melt viscosity of the binder resin composition is equal to higher than that of the insulating resin composition. When the lowest melt viscosity of the binder resin composition is equal to or higher than that of the first insulating resin composition, the conductive particle-containing layer 44 is easily curved between adjacent terminals during anisotropic conductive connection. Herein, the lowest melt viscosity is a value measured by a viscoelasticity measurement device (rheometer RS150, HAAKE).

<First Insulating Resin Composition Layer>

The lowest melt viscosity of the first insulating resin composition layer 41 is preferably adjusted to 10 to 5,000 mPa·s, and more preferably 50 to 3,000 mPa·s in terms of uniform flowability. The lowest melt viscosity can be adjusted by selection of kind of components of the resin composition, selection of mixing ratio, preparatory heating, or irradiation with UV.

The thickness of the first insulating resin composition layer 41 is preferably 0.5 to 30 μm, and more preferably 3 to 20 μm since short circuit after connection is prevented.

The first insulating resin composition layer 41 is a layer formed from an insulating thermoplastic resin composition, an insulating thermosetting resin composition, or an insulating photocurable resin composition. A component configuration of these resin compositions can be appropriately selected from known component configurations. It is preferable that the component configuration be a configuration of the thermosetting resin composition since most anisotropic conductive connection is carried out by thermocompression bonding. A process of polymerization of the thermosetting resin composition may be thermal radical polymerization, thermal cationic polymerization, or thermal anionic polymerization. The thermal anionic polymerization is preferred since curing at low temperature is rapid and connection is stable. Preferable examples of a thermally cationically polymerizable resin composition may include compositions obtained by mixing 5 to 80 parts by mass (preferably 10 to 70 parts by mass) of a thermally cationically polymerizable compound such as an epoxy compound, an oxetane compound, or a vinyl ether compound, 0.2 to 30 parts by mass (preferably 0.5 to 20 parts by mass) of a thermal cationic polymerization initiator such as an aromatic sulfonium salt, and 5 to 95 parts by mass (preferably 10 to 90 parts by mass) of a film-forming resin such as a phenoxy resin. If necessary, an additive such as a silane coupling agent, an anti-rust agent, a colorant, and a solvent can be added to the thermally cationically polymerizable resin composition.

<Conductive Particle-Containing Layer>

The conductive particle-containing layer 44 has a structure in which the conductive particles 42 are arranged in a single layer in the layered binder resin composition 43. A technique of arranging the conductive particles 42 in a single layer in the layered binder resin composition 43 is not particularly limited as long as the effects of the present invention are not impaired. For example, the technique disclosed in Patent Literatures 1 and 2 described in the Background Art section can be used.

As the conductive particles 42, conductive particles constituting known anisotropic conductive films can be used. Examples thereof may include particles of metal such as nickel, and metal coated resin particles that have a layer plated with metal such as nickel on a surface of a resin core. An insulating thin film may be formed, if necessary.

The average particle diameter of such conductive particles 42 is preferably 1 to 20 μm, and more preferably 2 to 10 μm from the viewpoint of a contact performance between a terminal to be connected and the conductive particles.

The density of the conductive particles in the conductive particle-containing layer 44 is preferably 5,000 to 80,000 particles/mm$^2$, and more preferably 10,000 to 60,000 particles/mm$^2$ from the viewpoint of prevention of short circuit.

In the conductive particle-containing layer 44, the inter-particle distance between the adjacent conductive particles is preferably 1 μm or more, more preferably 1 μm or more and 30 times or less the particle diameter of the conductive particles, and particularly preferably 2 μm or more and 20 times or less the particle diameter of the conductive particles from the viewpoint of prevention of short circuit. The interparticle distance means a distance between any arranged conductive particle and a conductive particle closest to the conductive particle. A conductive particle selected to determine the interparticle distance is one that is present independently without aggregation.

The binder resin composition 43 constituting the conductive particle-containing layer 44 may have the same configuration as that of the first insulating resin composition except that the lowest melt viscosity of the binder resin composition is equal to or higher than that of the first insulating resin composition.

The thickness of the conductive particle-containing layer 44 is preferably 0.3 times or more and 3 times or less the particle diameter of the conductive particles, and more preferably 0.5 times or more and 2 times or less the particle diameter of the conductive particles from the viewpoint of the stable retentivity of the conductive particles.

<Anisotropic Conductive Film of Another Aspect>

Figure 5:
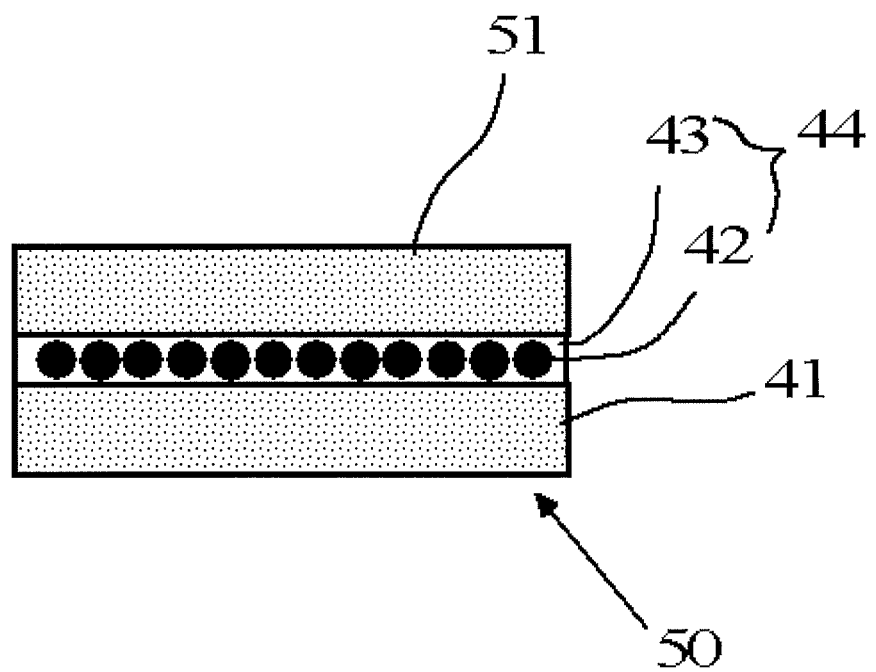
FIG. 5 is a cross-sectional view of an anisotropic conductive film of the present invention.

As shown in FIG. 5, an anisotropic conductive film 50 of another aspect of the present invention has a structure in which a second insulating resin composition layer 51 is further layered on a surface of the conductive particle-containing layer 44 on a side opposite to the first insulating resin composition layer 41. In this aspect, the lowest melt viscosity of the binder resin composition 43 constituting the conductive particle-containing layer 44 is also higher than the lowest melt viscosities of the first and second insulating resin composition layers 41 and 51. When the lowest melt viscosity of the binder resin composition 43 is higher than those of the first and second insulating resin composition layers 41 and 51, the conductive particle-containing layer 44 is easily curved between adjacent terminals during anisotropic conductive connection.

<Second Insulating Resin Composition Layer>

The component configuration and thickness of the second insulating resin composition layer 51 may be the same as those of the first insulating resin composition layer 41.

The lowest melt viscosities of the first and second insulating resin compositions may be the same as each other. It is preferable that the lowest melt viscosity of one of the first and second insulating resin compositions be higher than that of the other from the viewpoint of the stabilized flow for preventing the contact of the conductive particles. In this case, a difference between the lowest melt viscosities of the first and second insulating resin compositions is adjusted preferably to 50 to 10,000 mPa·s, and more preferably 100 to 5,000 mPa·s from the viewpoint of the controlled direction of flow.

When the lowest melt viscosities of the first and second insulating resin compositions are the same or substantially the same as each other, it is preferable that the thickness of one of the first insulating resin composition layer 41 and the second insulating resin composition layer 51 be larger than that of the other by 1 to 20 μm, and more preferably 2 to 15 μm. This is because flow in the same direction is achieved.

<Production of Anisotropic Conductive Film Having Structure Shown in FIG. 4>

The anisotropic conductive film having a structure shown in FIG. 4 can be produced by various techniques. One example of the techniques will be described below.

(Formation of First Insulating Resin Composition Layer)

The thermally cationically polymerizable compound, the thermal cationic polymerization initiator, and the film-forming resin are dissolved in a solvent such as ethyl acetate and toluene so that the solid content is 50%. The obtained solution is applied to a release PET base film at a predetermined dried thickness by a known technique, and dried, for example, in an oven at 50 to 80° C. for 3 to 10 minutes. Thus, the first insulating resin composition layer can be formed on the release PET base film.

(Formation of Conductive Particle-Containing Layer)

Figure 6A:
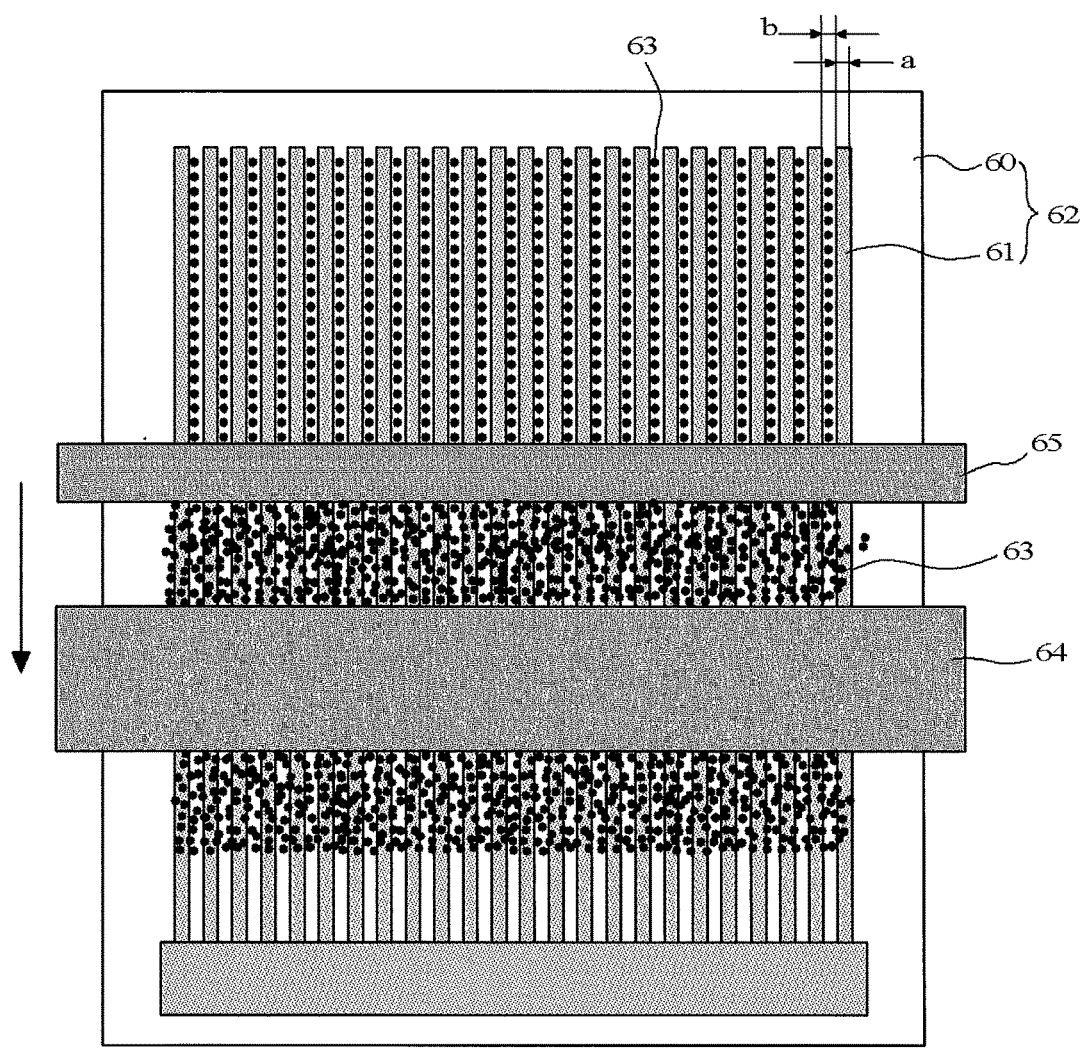
FIG. 6A is a view illustrating the configuration of a device of arranging conductive particles in a single layer.
Figure 6B:
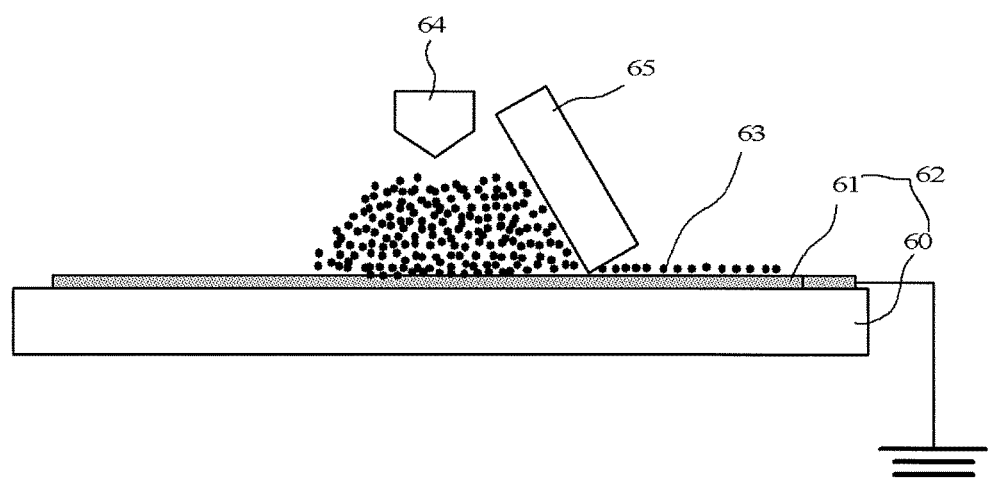
FIG. 6B is a view illustrating the configuration of the device of arranging conductive particles in a single layer.
Figure 6C:
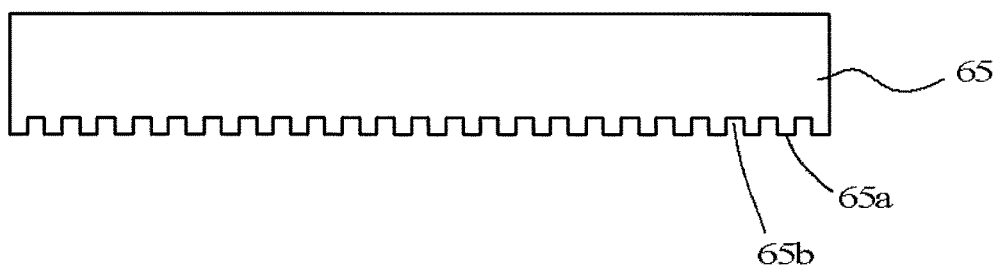
FIG. 6C is a cross-sectional view of a conductive squeegee.

As shown in FIGS. 6A and 6B, a wiring substrate 62 in which linear electrodes 61 each having a predetermined electrode width a, a predetermined distance b between the electrodes, and a predetermined electrode depth c are provided on an insulating substrate 60 is prepared. A positive potential is applied to the linear electrodes 61. Conductive particles 63 are dispersed on a surface of the wiring substrate 62. Subsequently, a charging device 64 for positively charging the conductive particles 63 is positioned so as to be orthogonal to the linear electrodes 61 and movable in a lengthwise direction of the linear electrodes 61. A conductive squeegee 65 for squeezing the conductive particles 63 that are positively charged by the charging device 64 is mounted on the wiring substrate 62. On a squeegee surface of the conductive squeegee 65, rectangular convex portions 65a corresponding to the width a of the linear electrodes and concave portions 65b corresponding to the distance b between the electrodes are alternately provided (FIG. 6C). Subsequently, the charging device 64 is shifted in the lengthwise direction of the linear electrodes 61 while the conductive particles 63 are positively charged by the charging device 64. Thus, the positively charged conductive particles 63 are gathered between the linear electrodes 61 with the positive potential being applied. After the charging device 64 is shifted, the surface of the wiring substrate 62 is squeezed by the conductive squeegee 65 so that the rectangular convex portions 65a come into contact with the linear electrodes 61. Thus, the conductive particles 63 of a single layer can be arranged linearly between the linear electrodes 61.

The binder resin composition layer that is formed on the release PET base film in the same manner as in the formation of the first insulating resin composition layer is thermocompression bonded to the linearly arranged conductive particles so as not to be fully cured, and the conductive particles are transferred to the binder resin composition layer so as to be embedded therein. Thus, the conductive particle-containing layer can be formed on the release PET base film. As a technique for arranging the conductive particles, a known technique such as a technique using a stretched film and a transferring technique using a mold can be used. It is desirable that 90% or more, and preferably 95% or more of the conductive particles in terms of the number be arranged with regularity. The regularity means that an arrangement is not random.

(Integration of Conductive Particle-Containing Layer and First Insulating Resin Composition Layer)

The first insulating resin composition layer and the conductive particle-containing layer prepared as described above are opposed to each other, and thermocompression bonded so as not to be fully cured, thereby being integrated. The anisotropic conductive film having a structure shown in FIG. 4 can thus be obtained.

<Production of Anisotropic Conductive Film Having Structure Shown in FIG. 5>

The anisotropic conductive film having a structure shown in FIG. 5 can be produced by various techniques. One example of the techniques will be described below.

The first insulating resin composition layer and the conductive particle-containing layer are formed in the same manner as in the production of the anisotropic conductive film having a structure shown in FIG. 4. The second insulating resin composition layer is formed in the same manner as in the formation of the first insulating resin composition layer. The conductive particle-containing layer prepared as described above is disposed between the first insulating resin composition layer and the second insulating resin composition layer, and they are thermocompression bonded so as not to be fully cured, thereby being integrated. Thus, the anisotropic conductive film having a structure shown in FIG. 5 can be obtained.

<Connected Body>

Figure 1A:
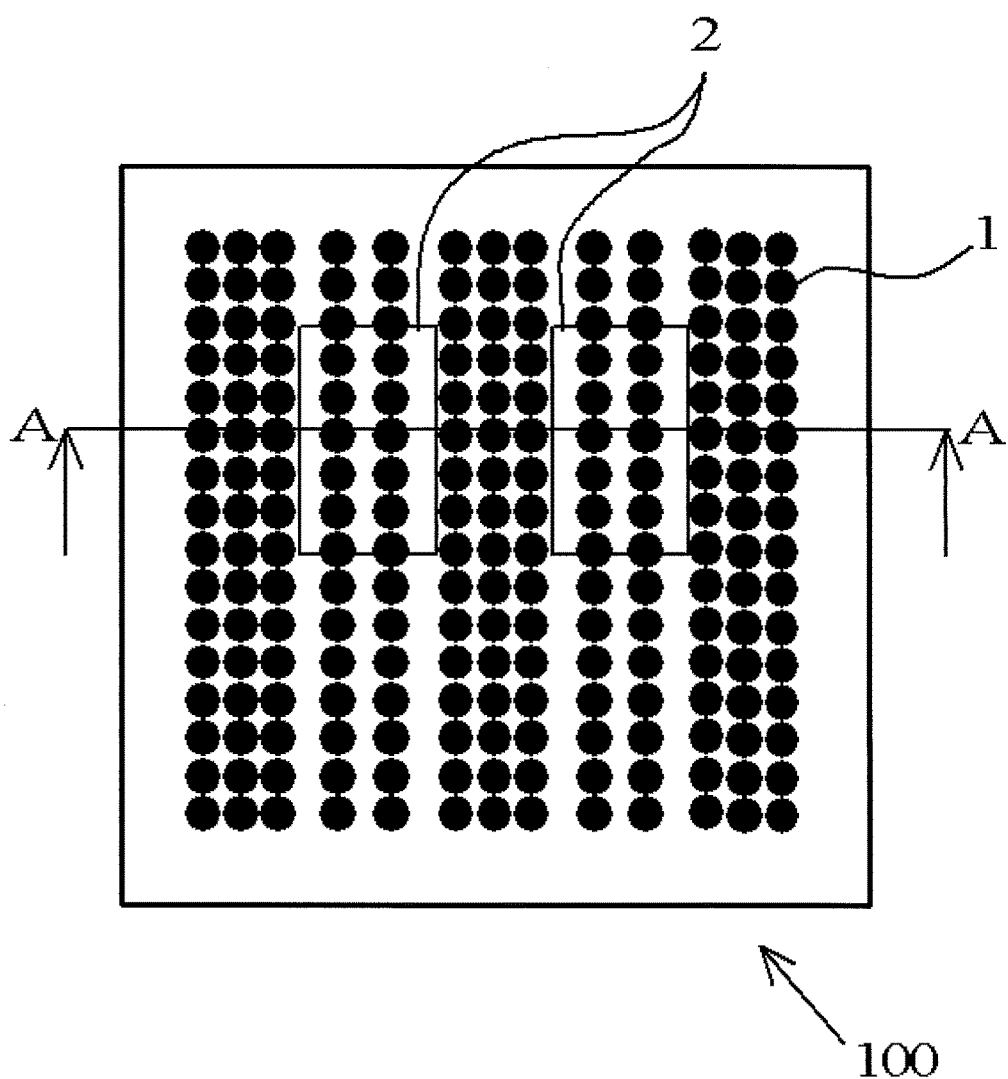
FIG. 1A is a perspective plane view of a connected body.
Figure 1B:
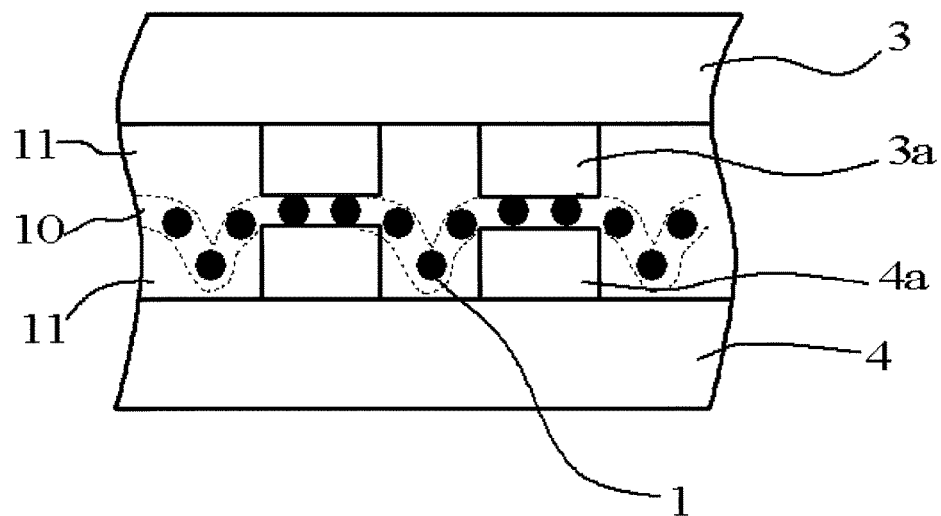
FIG. 1B is a cross-sectional view taken along line A-A in FIG. 1A.
Figure 2:
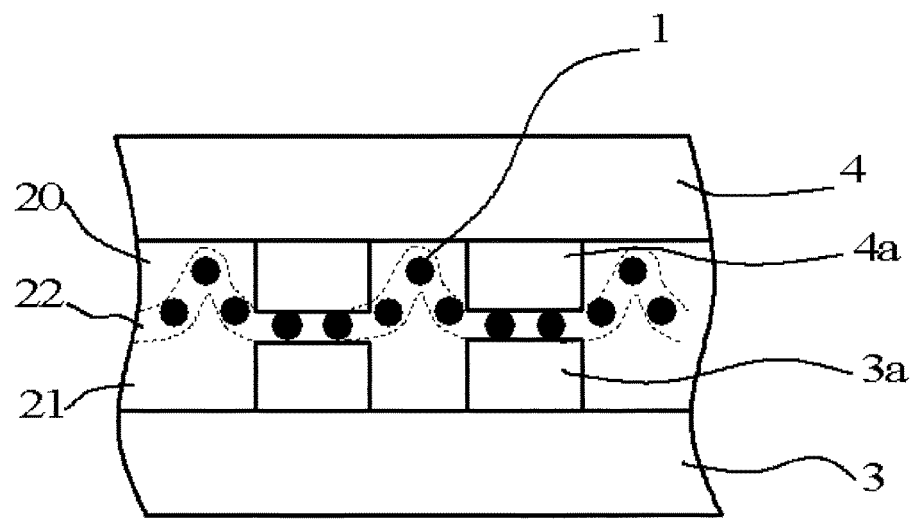
FIG. 2 is a cross-sectional view of a connected body.
Figure 3:
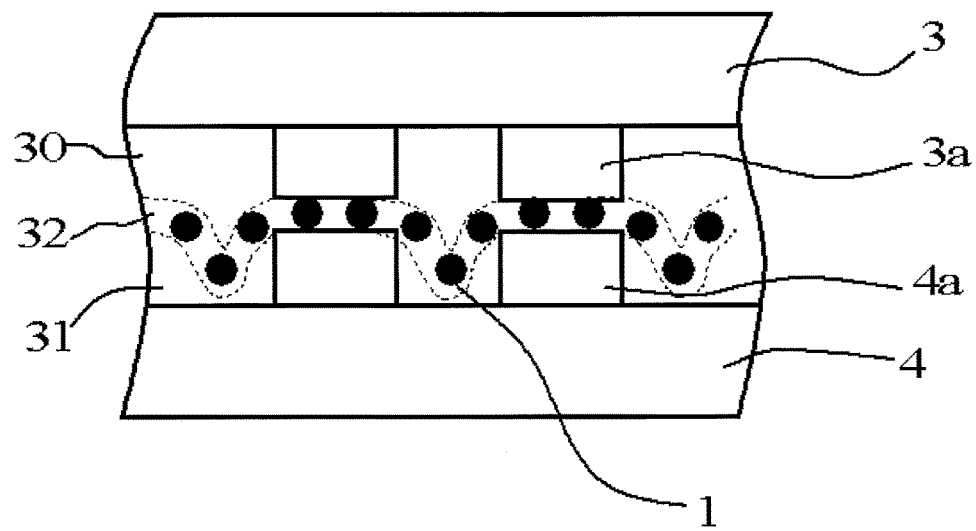
FIG. 3 is a cross-sectional view of a connected body.

The anisotropic conductive film of the present invention is disposed between a terminal (for example, a bump) of a first electrical component (for example, an IC chip) and a terminal (for example, a bump or a pad) of a second electrical component (for example, a wiring substrate), and thermocompression bonded from sides of the first and second electrical components, and fully cured, resulting in anisotropic conductive connection. Thus, a connected body is obtained. When the connected body is observed from a plane direction, it may appear that adjacent electrodes are short-circuited as shown in FIG. 1A. However, when a cross section thereof is observed from a side direction thereof, the conductive particle-containing layer is curved as shown in FIG. 1B, and the conductive particles are not in contact with each other and are insulated in the plane direction. Therefore, in the connected body, the occurrence of short circuit is suppressed and a decrease in conduction reliability is also suppressed. In the observation from the plane direction, the conductive particles appear to be in contact with each other. In consideration of the observation, it is shown that the regularity of particles effectively acts to suppress short circuit. A state where the conductive particle-containing layer is curved shows that a group of the arranged conductive particles exhibits flexibility.

EXAMPLES

Hereinafter, the present invention will be described specifically by way of Examples.

Examples 1 to 8 and Comparative Examples 1 and 2

(Formation of First Insulating Resin Composition Layer)

In accordance with a chemical composition (unit: part by mass) shown in Table 1, a first insulating resin composition mixed liquid with a solid content of 50% was prepared using toluene. This mixed liquid was applied to a release PET base sheet so that a dried thickness was one as shown in Table 1, and dried at 80° C. for 5 minutes, to form a first insulating resin composition layer. The lowest melt viscosity of the first insulating resin composition layer was measured by a viscoelasticity measurement device (rheometer RS150, HAAKE). The results are shown in Table 1.

(Formation of Second Insulating Resin Composition Layer)

In accordance with the chemical composition (unit: part by mass) shown in Table 1, a second insulating resin composition mixed liquid with a solid content of 50% was prepared using toluene. This mixed liquid was applied to a release PET base sheet so that a dried thickness was one as shown in Table 1, and dried at 80° C. for 5 minutes, to form a second insulating resin composition layer. The lowest melt viscosity of the second insulating resin composition layer was measured by a viscoelasticity measurement device (rheometer RS150, HAAKE). The results are shown in Table 1.

(Formation of Conductive Particle-Containing Layer)

In accordance with the chemical composition (unit: part by mass) shown in Table 1, a binder resin composition mixed liquid with a solid content of 50% was prepared using toluene. This mixed liquid was applied to a release PET base sheet so that a dried thickness was one as shown in Table 1, and dried at 80° C. for 5 minutes, to form a binder resin composition layer. The lowest melt viscosity of the binder resin composition layer was measured by a viscoelasticity measurement device (rheometer RS150, HAAKE). The results are shown in Table 1.

Subsequently, conductive particles having an average particle diameter of 3 µm (AUL703, SEKISUI CHEMICAL CO., LTD.) were linearly arranged in a single layer at a particle density shown in Table 1 by a device shown in FIGS. 6A and 6B (electrode width: Table 1, distance between electrodes: 3.5 µm, electrode depth: 3.5 µm). The binder resin composition layer was disposed on the conductive particles linearly arranged in a single layer, and they were subjected to lamination at 40° C. and 0.1 MPa from a side of the release PET base sheet. Thus, a conductive particle-containing layer having a structure in which the conductive particles were pressed against the binder resin composition layer and a thickness shown in Table 1 was formed.
(Production of Anisotropic Conductive Film)

The first insulating resin composition layer was disposed on a surface of the conductive particle-containing layer on a side where the conductive particles were pressed in, and the second insulating resin composition layer was disposed on another surface. The whole layered body was subjected to lamination at 40° C. and 0.1 MPa to produce an anisotropic conductive film.

Example 9

An anisotropic conductive film of a two-layer structure was produced by the same operation as in Example 1 except that the second insulating resin composition layer was not used.

Example 10

An anisotropic conductive film of a two-layer structure was produced by the same operation as in Example 1 except that the first insulating resin composition layer was not used.
<Evaluation of Connected Body>
(Production of Connected Body)

Bumps of an IC chip were anisotropically conductively connected to electrodes of a wiring substrate made of polyimide by thermocompression bonding using the anisotropic conductive film produced in each of Examples and Comparative Examples. During the anisotropic conductive connection, the first insulating resin composition layer was disposed on an IC chip side.

Thermocompression bonding conditions: 180° C., 80 MPa, 5 seconds
 Size of IC chip: 1.5 mm×13 mm, 0.5 mmt
 Bumps of IC chip: gold-plated bump, 25 μm×25 μm, height of bump: Table 1, space between bumps: 7.5 μm
 Electrodes of wiring substrate: gold-plated electrode, line/space=16.5 μm/16 μm, height of electrode: Table 1, space between electrodes: 7.5 μm
(Performance Evaluation)

As described below, "conductive particle capture number," "occurrence rate of short circuit," "initial conduction resistance," "conduction resistance (conduction reliability) after high temperature and high humidity load test," "curve direction of conductive particle-containing layer," "curve length of conductive particle-containing layer," and "distance between conductive particles" of the obtained connected body were measured. The obtained results are shown in Table 1.
"Conductive Particle Capture Number"

Any 300 bumps were selected from all the compression bonded bumps of the IC, and the number of the conductive particles present on the bumps was counted using a microscope. The average and standard deviation thereof were determined. For practical use for connection, it is desirable that the conductive particle number satisfy a value of average −3σ of 3 or more.
"Occurrence Rate of Short Circuit"

The occurrence rate of short circuit was calculated by "occurrence rate of short circuit/total number of space of 7.5 μm." For practical use, the rate is desirably 100 ppm or less.
"Initial Conduction Resistance"

The initial conduction resistance of the connected body immediately after production was measured by a commercially available resistance measurement device. For practical use, the initial conduction resistance is desirably 10Ω or less.
"Conduction Resistance (Conduction Reliability) after High Temperature and High Humidity Load Test"

The connected body was allowed to stand for 1,000 hours in a chamber where 85° C. and 85% Rh were maintained, and the conduction resistance of the connected body was then measured by a commercially available resistance measurement device. For practical use, the conduction resistance is desirably 10Ω or less.
"Curve Direction of Conductive Particle-Containing Layer"

An anisotropic connection portion of a connection structure was cut in a direction that was perpendicular to a plane direction and orthogonal to the linear arrangement of the conductive particles, and the cut surface was observed by a microscope. The "curve direction of the conductive particle-containing layer" was examined. When a curve of the conductive particle-containing layer present at a space between the bumps in the plane direction of the connected body is convex toward the first insulating resin composition layer side, the curve direction is judged to be "upward." When the curve is convex toward the second insulating resin composition layer side, the curve direction is judged to be "downward."
"Curve Length of Conductive Particle-Containing Layer"

The anisotropic connection portion of the connection structure was cut in a direction that was perpendicular to a plane direction and orthogonal to the linear arrangement of the conductive particles, and the cut surface was observed by a microscope. The "curve length of the conductive particle-containing layer" was determined. The shortest distance between a line that extends from a center between the opposite bumps anisotropically conductively connected in a horizontal direction and a distal end of the curved convex portion of the conductive particle-containing layer is taken as "curve length of the conductive particle-containing layer."
<Distance Between Conductive Particles>

The anisotropic connection portion of the connection structure was cut in a direction that was perpendicular to a plane direction and orthogonal to the linear arrangement of the conductive particles, and the cut surface was observed by a microscope. The "distance between the conductive particles" was determined. A distance between adjacent conductive particles in the conductive particle-containing layer present in a space between the bumps in the plane direction of the connection structure is taken as the "distance between the conductive particles."

TABLE 1

| | | | | Comparative Example | | Example | | | |
|---|---|---|---|---|---|---|---|---|---|
| | | | | 1 | 2 | 1 | 2 | 3 | 4 |
| First Insulating | YP-50 | Phenoxy Resin | Nippon Steel & Sumikin Chemical Co., Ltd. | 60 | 60 | 80 | 80 | 60 | 60 |

TABLE 1-continued

|  |  |  |  |  |  |  |  |  |  |
|---|---|---|---|---|---|---|---|---|---|
| Resin Composition Layer | jER828 | Epoxy Resin | Mitsubishi Chemical Corporation | 40 | 40 | 20 | 20 | 40 | 40 |
|  | SI-60L | Curing Agent | Sanshin Chemical Industry Co., Ltd. | 2 | 2 | 2 | 2 | 2 | 2 |
|  | Melt Viscosity (mPa · s) |  |  | 600 | 600 | 200 | 200 | 600 | 600 |
|  | Thickness (μm) |  |  | 6 | 6 | 6 | 11 | 6 | 11 |
| Conductive Particle-Containing Layer | YP-50 | Phenoxy Resin | Nippon Steel & Sumikin Chemical Co., Ltd. | 60 | 60 | 40 | 40 | 40 | 40 |
|  | jER828 | Epoxy Resin | Mitsubishi Chemical Corporation | 40 | 40 | 60 | 60 | 60 | 60 |
|  | SI-60L | Curing Agent | Sanshin Chemical Industry Co., Ltd. | 2 | 2 | 2 | 2 | 2 | 2 |
|  | Melt Viscosity (mPa · s) |  |  | 600 | 600 | 1800 | 1800 | 1800 | 1800 |
|  | Thickness (μm) |  |  | 6 | 6 | 6 | 6 | 6 | 6 |
|  | Linear Electrode Width For Particle Arrangement |  |  | 2.2 | 6.5 | 2.2 | 2.2 | 2.2 | 2.2 |
|  | Particle Density (pcs/mm²) |  |  | 30000 | 10000 | 30000 | → | → | → |
| Second Insulating Resin Composition Layer | YP-50 | Phenoxy Resin | Nippon Steel & Sumikin Chemical Co., Ltd. | 60 | 60 | 60 | 60 | 60 | 60 |
|  | jER828 | Epoxy Resin | Mitsubishi Chemical Corporation | 40 | 40 | 40 | 40 | 40 | 40 |
|  | SI-60L | Curing Agent | Sanshin Chemical Industry Co, Ltd. | 2 | 2 | 2 | 2 | 2 | 2 |
|  | Melt Viscosity (mPa · s) |  |  | 600 | 600 | 600 | 600 | 600 | 600 |
|  | Thickness (μm) |  |  | 6 | 6 | 6 | 1 | 6 | 1 |
| Connected Body Evaluation Results | Bump Height of IC Chip (μm) |  |  | 8 | 8 | 15 | 6 | 15 | 6 |
|  | Electrode Height of Wiring Substrate (μm) |  |  | 8 | 8 | 1 | 9 | 1 | 9 |
|  | Conductive Particle Capture Number | Average |  | 15 | 5 | 15 | → | → | → |
|  |  | Minimum |  | 7 | 2 | 7 | → | → | → |
|  | Initial Conduction Resistance | Ω |  | 0.1 | 0.1 | 0.1 | 0.1 | 0.1 | 0.1 |
|  | Conduction Resistance After High Temperature And High Humidity Load Test | Ω |  | 5 | 100 | 5 | 5 | 5 | 5 |
|  | Occurrence Rate of Short Circuit | ppm |  | 500 | 50 | 50 | 50 | 50 | 50 |
|  | Presence or Absence of Curve of Conductive Particle-Containing Layer |  |  | Absence | Absence | Presence | Presence | Presence | Presence |
|  | Curve Direction of Conductive Particle-Containing Layer |  |  | — | — | Upward | Downward | Upward | Downward |
|  | Curve Length of Conductive Particle-Containing Layer |  |  | 0 | 0 | 8 | 3 | 5 | 5 |
|  | Distance Between Conductive Particles |  |  | 2.5 | 6 | 5 | 3.5 | 4 | 4 |

|  |  |  |  | Example |  |  |  |  |  |
|---|---|---|---|---|---|---|---|---|---|
|  |  |  |  | 5 | 6 | 7 | 8 | 9 | 10 |
| First Insulating Resin Composition Layer | YP-50 | Phenoxy Resin | Nippon Steel & Sumikin Chemical Co., Ltd. | 80 | 60 | 80 | 80 | 60 | None |
|  | jER828 | Epoxy Resin | Mitsubishi Chemical Corporation | 20 | 40 | 20 | 20 | 40 |  |
|  | SI-60L | Curing Agent | Sanshin Chemical Industry Co., Ltd. | 2 | 2 | 2 | 2 | 2 |  |
|  | Melt Viscosity (mPa · s) |  |  | 200 | 600 | 200 | 200 | 600 |  |
|  | Thickness (μm) |  |  | 6 | 6 | 6 | 6 | 12 |  |
| Conductive Particle-Containing Layer | YP-50 | Phenoxy Resin | Nippon Steel & Sumikin Chemical Co., Ltd. | 40 | 40 | 40 | 40 | 60 | 60 |
|  | jER828 | Epoxy Resin | Mitsubishi Chemical Corporation | 60 | 60 | 60 | 60 | 40 | 40 |
|  | SI-60L | Curing Agent | Sanshin Chemical Industry Co., Ltd. | 2 | 2 | 2 | 2 | 2 | 2 |
|  | Melt Viscosity (mPa · s) |  |  | 1800 | 1800 | 1800 | 1800 | 600 | 600 |
|  | Thickness (μm) |  |  | 6 | 6 | 6 | 6 | 6 | 6 |
|  | Linear Electrode Width For Particle Arrangement |  |  | 2.2 | 2.2 | 3.5 | 1.5 | 2.2 | 2.2 |
|  | Particle Density (pcs/mm²) |  |  | → | → | 20000 | 40000 | 30000 | 30000 |
| Second Insulating Resin Composition Layer | YP-50 | Phenoxy Resin | Nippon Steel & Sumikin Chemical Co., Ltd. | 60 | 80 | 60 | 60 | None | 60 |
|  | jER828 | Epoxy Resin | Mitsubishi Chemical Corporation | 40 | 20 | 40 | 40 |  | 40 |
|  | SI-60L | Curing Agent | Sanshin Chemical Industry Co, Ltd. | 2 | 2 | 2 | 2 |  | 2 |
|  | Melt Viscosity (mPa · s) |  |  | 600 | 200 | 600 | 600 |  | 600 |
|  | Thickness (μm) |  |  | 6 | 6 | 6 | 6 |  | 12 |
| Connected Body Evaluation Results | Bump Height of IC Chip (μm) |  |  | 8 | 8 | 15 | 15 | 6 | 15 |
|  | Electrode Height of Wiring Substrate (μm) |  |  | 8 | 8 | 1 | 1 | 9 | 1 |
|  | Conductive Particle Capture Number | Average |  | → | → | 10 | 20 | 15 | 15 |
|  |  | Minimum |  | → | → | 5 | 10 | 7 | 7 |
|  | Initial Conduction Resistance | Ω |  | 0.1 | 0.1 | 0.1 | 0.1 | 0.1 | 0.1 |
|  | Conduction Resistance After High Temperature And High Humidity Load Test | Ω |  | 5 | 5 | 5 | 5 | 5 | 5 |
|  | Occurrence Rate of Short Circuit | ppm |  | 50 | 50 | 30 | 100 | 50 | 50 |
|  | Presence or Absence of Curve of Conductive Particle-Containing Layer |  |  | Presence | Presence | Presence | Presence | Presence | Presence |
|  | Curve Direction of Conductive Particle-Containing Layer |  |  | Upward | Downward | Upward | Upward | Downward | Upward |
|  | Curve Length of Conductive Particle-Containing Layer |  |  | 5 | 5 | 8 | 8 | 5 | 5 |
|  | Distance Between Conductive Particles |  |  | 4 | 4 | 6.5 | 3.5 | 5 | 5 |

<Consideration>

In the anisotropic conductive film of Example 9, the lowest melt viscosity of the binder resin composition constituting the conductive particle-containing layer was equal to or higher than that of the first insulating resin composition. Therefore, the conductive particle-containing layer in the connected body was curved convexly toward the wiring substrate side. Accordingly, the initial conduction resistance was low, and the conduction reliability after the high temperature and high humidity test was high. The occurrence of short circuit was also suppressed.

In the anisotropic conductive film of Example 10, the lowest melt viscosity of the binder resin composition constituting the conductive particle-containing layer was equal to or higher than that of the second insulating resin composition. Therefore, the conductive particle-containing layer in the connected body was curved convexly toward the IC chip side. Accordingly, the initial conduction resistance was low, and the conduction reliability after the high temperature and high humidity test was high. The occurrence of short circuit was also suppressed.

In the anisotropic conductive films of Examples 1, 2, and 5 to 8, the lowest melt viscosity of the binder resin composition constituting the conductive particle-containing layer was higher than the lowest melt viscosities of the first and second insulating resin compositions. In addition, the lowest melt viscosity of one of the first and second insulating resin compositions was higher than that of the other. Therefore, the conductive particle-containing layer in the connected body was curved convexly toward a side of insulating resin composition layer of which the lowest melt viscosity was lower. Accordingly, the initial conduction resistance was low, and the conduction reliability after the high temperature and high humidity load test was high. The occurrence of short circuit was also suppressed.

In the anisotropic conductive film of Example 3, the lowest melt viscosity of the binder resin composition constituting the conductive particle-containing layer was higher than the lowest melt viscosities of the first and second insulating resin compositions, but the lowest melt viscosities of the first and second insulating resin compositions were the same as each other. The bump height of the IC chip was however much larger than the electrode height of the wiring substrate. Therefore, the conductive particle-containing layer in the connected body was curved convexly toward the first insulating resin composition layer side that was the IC chip side. Accordingly, the initial conduction resistance was low, and the conduction reliability after the high temperature and high humidity load test was high. The occurrence of short circuit was also suppressed.

In the anisotropic conductive film of Example 4, the lowest melt viscosity of the binder resin composition constituting the conductive particle-containing layer was higher than the lowest melt viscosities of the first and second insulating resin compositions, but the lowest melt viscosities of the first and second insulating resin compositions were the same as each other. The thickness of the first insulating resin composition layer was however much larger than that of the second insulating resin composition layer. Therefore, the conductive particle-containing layer in the connected body was curved convexly toward the second insulating resin composition layer side that was the wiring substrate side. Accordingly, the initial conduction resistance was low, and the conduction reliability after the high temperature and high humidity load test was high. The occurrence of short circuit was also suppressed.

On the other hand, in the anisotropic conductive films of Comparative Examples 1 and 2, the densities of the conductive particles were different from each other, but the lowest melt viscosities of the first insulating resin composition, the binder resin composition, and the second insulating resin composition were the same as one another. In the connected body using the anisotropic conductive film of Comparative Example 1, the occurrence rate of short circuit was high. In the connected body using the anisotropic conductive film of Comparative Example 2, the conduction reliability was low.

INDUSTRIAL APPLICABILITY

According to the anisotropic conductive film of the present invention, the occurrence of short circuit during anisotropic conductive connection of electrical components having decreased pitch using the anisotropic conductive film can be suppressed, and a decrease in conduction reliability during storage under a high temperature and high humidity environment can be suppressed. Therefore, the anisotropic conductive film is useful when an IC chip is flip-chip mounted on a wiring substrate.

1, 42, 63 conductive particle
2 electrode
3 first electrical component
3a terminal
4 second electrical component
4a terminal
10, 22, 32, 44 conductive particle-containing layer
11, 20, 30, 41 first insulating resin composition layer
21, 31, 51 second insulating resin composition layer
40, 50 anisotropic conductive film
43 binder resin composition
60 insulating substrate
61 linear electrode
62 wiring substrate
64 charging device
65 conductive squeegee
65a rectangular convex portion
65b concave portion
a electrode width
b distance between electrodes
c electrode depth

The invention claimed is:
1. A connected body comprising:
a terminal of a first electrical component,
a terminal of a second electrical component, wherein the terminal of the first electrical component is anisotropically conductively connected to the terminal of the second electrical component through an anisotropic conductive film, which includes:
  (i) a conductive particle-containing layer containing conductive particles that are arranged in a single layer in a binder resin composition, and
  (ii) at least a first insulating resin composition layer, wherein
  the binder resin composition has a lowest melt viscosity that is equal to or higher than that of the first insulating resin composition,
  the conductive particle-containing layer is disposed on the first insulating resin composition layer,
  a thickness of the binder resin composition in the conductive particle-containing layer is greater than an average particle diameter of the conductive particle, and the conductive particle-containing layer is curved when a cross section of the connected body is observed from a side direction.

2. The connected body according to claim 1, wherein, when the connected body is observed from a plane direction, it appears that adjacent electrodes are short-circuited.

3. The connected body according to claim 1, wherein the anisotropic conductive film further comprises a second insulating resin composition layer layered on a surface of the conductive particle-containing layer on a side opposite to the first insulating resin composition layer, and the lowest melt viscosity of the binder resin composition is higher than those of the first and second insulating resin compositions.

4. A method of manufacturing a connected body, comprising:
  anisotropically conductively connecting a terminal of a first electrical component to a terminal of a second electrical component through an anisotropic conductive film, which includes:
    (i) a conductive particle-containing layer containing conductive particles that are arranged in a single layer in a binder resin composition, and
    (ii) at least a first insulating resin composition layer, wherein
  the binder resin composition has a lowest melt viscosity that is equal to or higher than that of the first insulating resin composition,
  the conductive particle-containing layer is disposed on the first insulating resin composition layer,
  a thickness of the binder resin composition in the conductive particle-containing layer is greater than an average particle diameter of the conductive particles, and
  the conductive particle-containing layer is curved when a cross section of the connected body is observed from a side direction.

5. The method according to claim 4, wherein the anisotropic conductive film further comprises a second insulating resin composition layer layered on a surface of the conductive particle-containing layer on a side opposite to the first insulating resin composition layer, and the lowest melt viscosity of the binder resin composition is higher than those of the first and second insulating resin compositions.

* * * * *